(12) United States Patent
Mabuchi

(10) Patent No.: US 6,822,306 B2
(45) Date of Patent: Nov. 23, 2004

(54) SOLID-STATE IMAGING DEVICE AND METHOD FOR MANUFACTURING SAME

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 128 days.

(21) Appl. No.: 10/245,562

(22) Filed: Sep. 16, 2002

(65) Prior Publication Data

US 2003/0054585 A1 Mar. 20, 2003

(30) Foreign Application Priority Data

Sep. 17, 2001 (JP) .................................... P2001-281295

(51) Int. Cl.$^7$ ............................................... H01L 29/04
(52) U.S. Cl. ....................... 257/443; 257/448; 438/24; 438/149
(58) Field of Search ............................. 257/59, 66, 72, 257/443–448; 438/22–24, 29–30

(56) References Cited

U.S. PATENT DOCUMENTS

2003/0122131 A1 * 7/2003 Zhang et al. .................. 257/72

* cited by examiner

Primary Examiner—H. Jey Tsai
(74) Attorney, Agent, or Firm—Robert J. Depke; Holland & Knight LLP

(57) ABSTRACT

The reduction in size, noise and voltage is realized in a MOS solid-state imaging device. A gate electrode in a pixel part is formed in a two-level structure. An amplifier gate of an amplifier transistor is formed in the first level while a select gate of a select transistor is formed in the second level. The both are structurally partly overlapped. With the first-level amplifier gate as self-alignment, ions are implanted for a select gate in the second level. Although the gate electrode if formed in one level as in the conventional requires a space of nearly a design rule between the amplifier gate and the select gate, the structure of the invention can eliminate such a dead space. Meanwhile, because the diffusion layer does not exist between the amplifier gate and the select gate, the diffusion layer is eliminated of sheet resistance and voltage drop. Also, the resistance and voltage decrease, resulting from the LDD region of a transistor gate end, are eliminated in one end of the amplifier gate and in one end of the select gate.

7 Claims, 5 Drawing Sheets

SOLID-STATE IMAGING DEVICE AND METHOD FOR MANUFACTURING SAME

This application claims priority to Japanese Patent Application Number JP2001-281295 filed Sep. 17, 2001, which is incorporated herein by reference.

BACKGROUND OF THE INVENTION

1. Field of the Invention

This invention relates to a solid-state imaging device having a structure having a plurality of photoelectric converting elements each configuring an imaging pixel to read out photo-charges stored on the photoelectric converting elements by the use of a plurality of transistors, and to a method for manufacturing same. More particularly, the invention relates to a solid-state imaging device to be made in a reduced size and voltage, and to a method for manufacturing same.

2. Description of the Related Art

Conventionally, as a solid-state imaging device of the above kind, there has been a proposal of a MOS-type solid imaging device having, in each imaging pixel, a photodiode for photoelectric conversion and various MOS transistors for transferring, selecting, amplifying and resetting the photo-charges stored on the photodiode.

FIG. 5 is a circuit diagram showing a configuration example of a related-art pixel part in such a MOS-type solid-state imaging device.

FIG. 5 shows a configuration up to outputting the photo-electrons stored on a photodiode 10 onto a vertical signal line 12, wherein the vertical signal line 12 has, at its lower end, a voltage output to a signal processing circuit of a hereinafter-referred S/H-CDS circuit.

Meanwhile, the vertical signal line 12, at an upper end, is connected to a load transistor 14 serving as a constant-current source at the outside of the pixel part.

As shown in the figure, four MOS transistors 20, 22, 24, 26 are provided around the photodiode (hereinafter, referred to as PD) 10.

At first, a reset transistor 20 and a transfer transistor 22 are connected in tandem between a drive power source (drive voltage Vdd) and the PD 10. A floating diffusion region (hereinafter, referred to as FD region) 16 is provided between a source of the reset transistor 20 and a drain of the transfer transistor 22.

Meanwhile, a select transistor 24 and an amplifier transistor 26 are connected in tandem between the vertical signal line 12 and the drive power source (drive voltage Vdd). The amplifier transistor 26 has a gate connected to the FD region 16.

A reset pulse is inputted to a gate of the reset transistor 20, a transfer pulse is to a gate of the transfer transistor 22, and select pulse is to a gate of the select transistor 24.

In this structure, in case the select transistor 24 is turned ON, the amplifier transistor 26 and the constant-current source 14 at the outside of the imaging region constitute a source follower. Consequently, the potential on the vertical signal line 12 has a value following a gate voltage of the amplifier transistor 26, i.e. a potential at the FD region 16, which is inputted to a signal processing circuit.

Note that actually a plurality of pixel parts are connected to one vertical signal line so that a particular pixel can be selected by the select transistor 24.

In the meanwhile, the conventional solid-state imaging device as in the above has a defect that the pixel is difficult to reduce in its size because PD and four transistors are required in one pixel.

Accordingly, it is one of the major problems to decrease, to what extent, the area the transistors occupy of the pixel area in order to increase the area for the PD.

Meanwhile, in the imaging region entirety, there are arranged in series, on the current path thereof, select transistors, amplifier transistors and diffusion layers between them. In a particularly small pixel, the transistor is small in its W length to increase resistance, resulting in a problem that voltage reduction is difficult due to the amount of voltage drop and noise increases.

It is an object of the present invention to provide a solid-state imaging device that is possible to reduce the arrangement area of the amplifier and select transistors in each of a plurality of pixel parts, thus enabling the reduction in size, voltage, noise and the like, and a method for manufacturing the same.

SUMMARY OF THE INVENTION

The present invention is characterized by having an imaging section having a plurality of pixel parts, the pixel part comprising: photoelectric converting means for storing photo-charge depending upon an amount of light reception; an amplifier transistor for taking out a signal corresponding to the photo-charge stored on the photoelectric converting means; a select transistor for connecting selectively an output of the amplifier transistor to a signal line that is connected to a current source at an outside of the imaging section; a gate electrode of the pixel part formed at least in a two-level structure; a gate electrode of the amplifier transistor formed in a first level of the two-level structure; and a gate electrode of the select transistor formed in a second level of the two-level structure.

Also, the invention is characterized by having an imaging section having a plurality of pixel parts, the pixel part comprising; photoelectric converting means for storing photo-charges depending upon an amount of light reception; an amplifier transistor for taking out a signal corresponding to the photo-charge stored on the photoelectric converting means; a select transistor for connecting selectively an output of the amplifier transistor to a signal line that is connected to a current source at an outside of the imaging section; a gate electrode of the pixel part formed at least in a two-level structure; a gate electrode of the amplifier transistor formed in a first level of the two-level structure; and a gate electrode of the select transistor formed in a second level of the two-level structure; wherein the select transistor has a channel layer formed self-aligned by implanting ions to a region below the gate electrode of the select transistor after forming a gate electrode of the amplifier transistor in the first level.

According to the solid-state imaging device of the invention, the gate electrode of the pixel part is formed in a two-level structure wherein the gate electrode of the amplifier transistor is formed in a first level of the two-level structure and the gate electrode of the select transistor is formed in a second level of the two-level structure. Consequently, because the gate of the amplifier transistor and the gate of the select transistor can be closely arranged without a spacing, it is possible to reduce the arrangement space of the amplifier and select transistors. This contributes to size reduction of the solid-state imaging device entirety due to the size reduction in the pixel parts. Correspondingly, the arrangement space of the photoelectric converting means can be enlarged, making possible to contribute to the improvement in imaging sensitivity.

Meanwhile, because the amplifier transistor and the select transistor are closely arranged, the resistance on a current path can be reduced to realize the reduction in voltage and noise.

According to the method for manufacturing a solid-state imaging device of the invention, the gate electrode of the pixel part is formed in a two-level structure wherein the gate electrode of the amplifier transistor is formed in a first level of the two-level structure and the gate electrode of the select transistor is formed in a second level of the two-level structure. This can reduce the arrangement space of the amplifier and select transistors, thus contributing to size reduction of the solid-state imaging device entirety due to the size reduction in the pixel parts. Correspondingly, the arrangement space of the photoelectric converting means can be enlarged, making possible to contribute to the improvement in imaging sensitivity.

Meanwhile, because the amplifier transistor and the select transistor are closely arranged, the resistance on a current path can be reduced to realize the reduction in voltage and noise.

Furthermore, in this manufacturing method, a channel layer of the select transistor is formed self-aligned by implanting ions to a region below the gate electrode of the select transistor after forming a gate electrode of the amplifier transistor in the first level. Consequently, the amplifier transistor can be suppressed from deviating in characteristic. Eliminated is a potential gap as encountered in the two-level gate.

DETAILED DESCRIPTION OF THE PREFERRED EMBODIMENTS

An embodiment of the present invention will now be explained with reference to the drawings.

Figure 1:
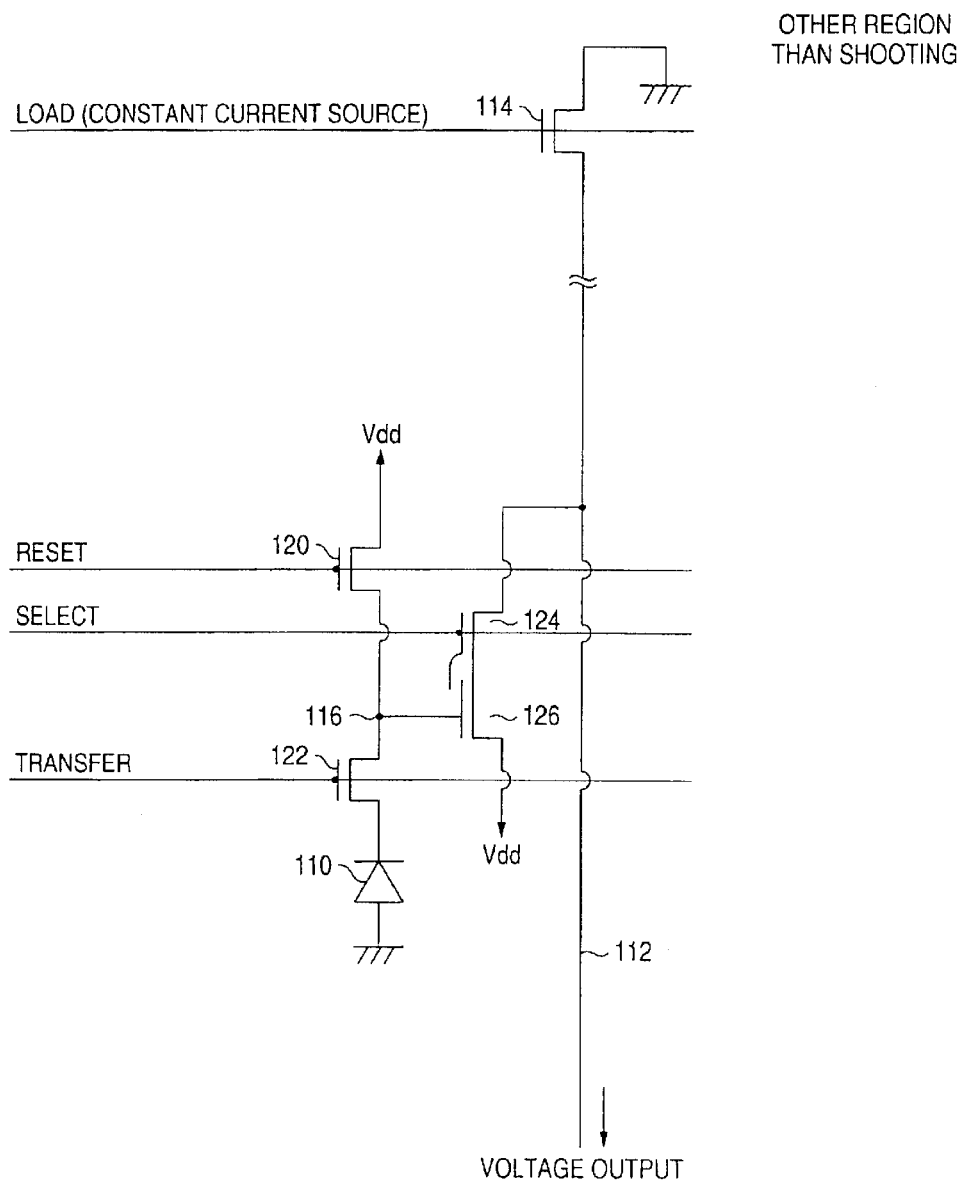
FIG. 1 is a circuit diagram showing a configuration example of a pixel part in a solid-state imaging device of the present invention.
Figure 2:
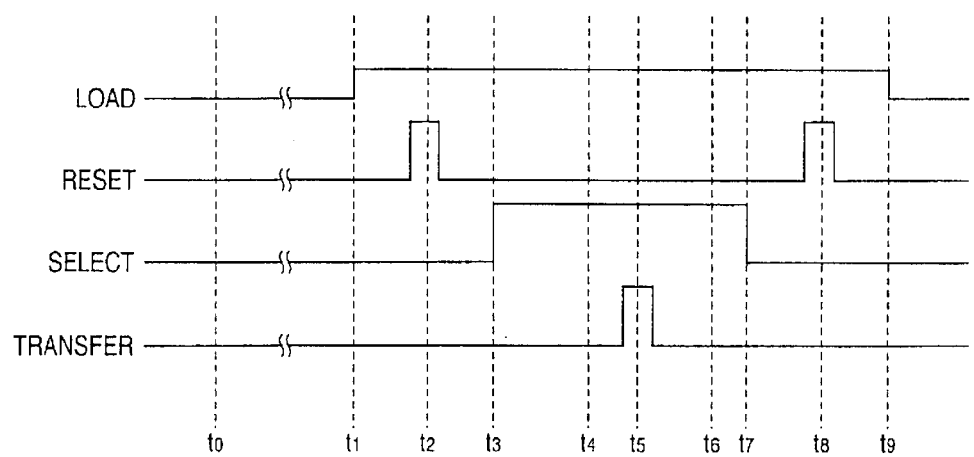
FIG. 2 is a timing chart showing an operation example of the pixel part shown in FIG. 1.

FIG. 1 shows a circuit diagram showing a configuration example of a pixel part in a solid-state imaging device of the invention. FIG. 2 is a timing chart showing an operation example of the pixel part shown in FIG. 1.

Figure 3:
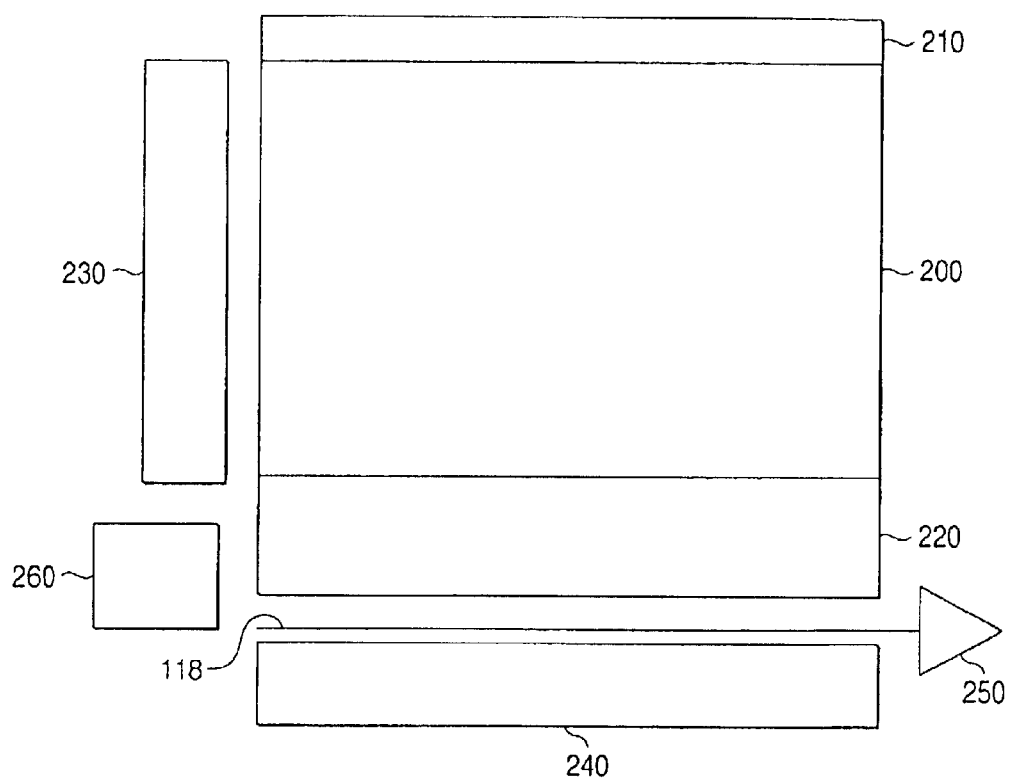
FIG. 3 is a plan view showing an overall structure of a solid-state imaging device having the pixel parts shown in FIG. 1.

Meanwhile, FIG. 3 is a plan view showing an overall structure of a MOS solid-state imaging device provided with the pixel parts of FIG. 1.

Figure 5:
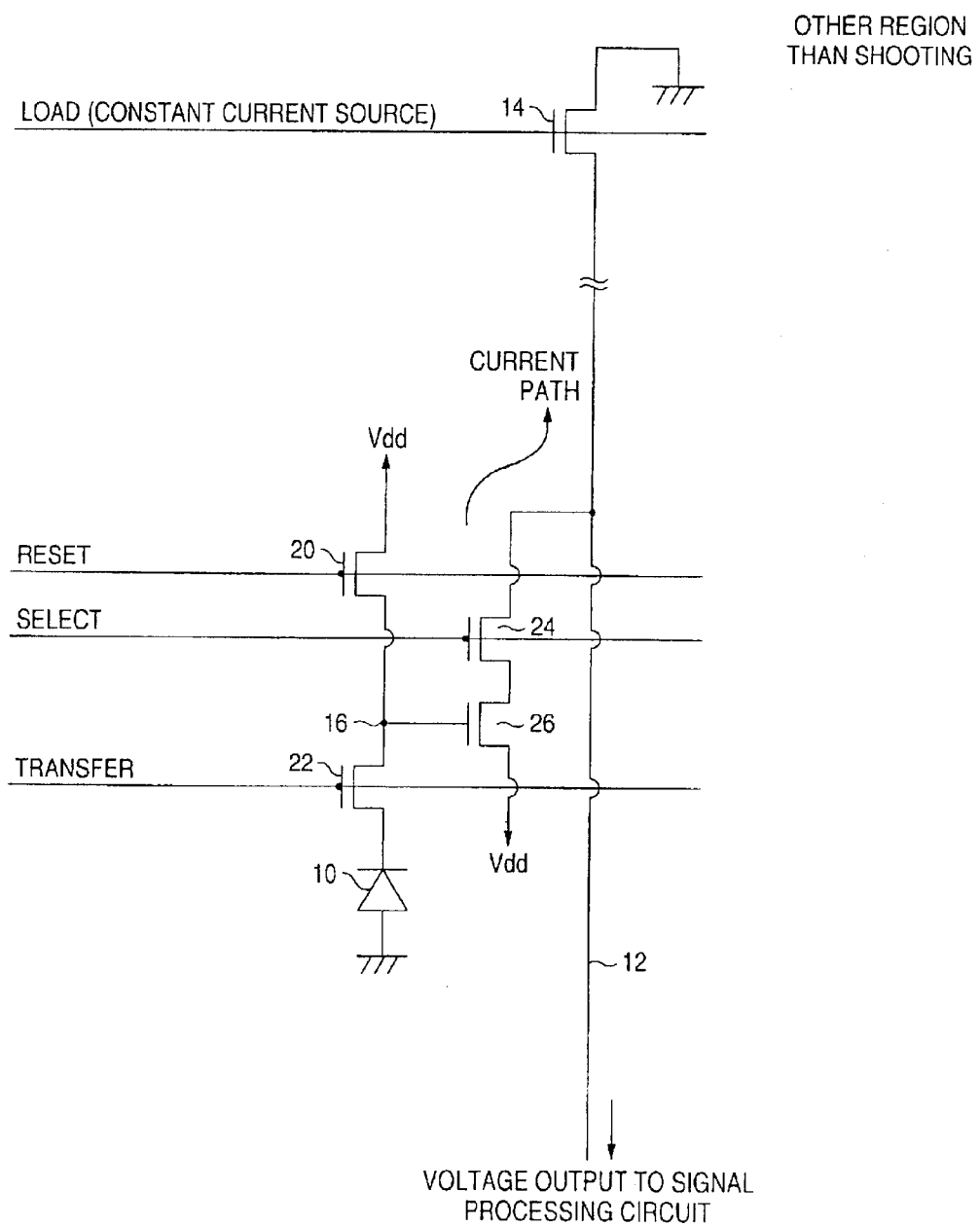
FIG. 5 is a circuit diagram showing a configuration example of a pixel part in a solid-state imaging device of a related art.

The solid-state imaging device is different from the related art of FIG. 5 in that the gate electrode in the pixel part is formed at least in a two-level structure. In a first level is formed a gate electrode (amplifier gate) of an amplifier transistor 126 while in a second level is formed a gate electrode (select gate) of a select transistor 124. The both are partly overlapped. Note that FIG. 1 typically shows the leveled structure.

In case a gate electrode is formed in one level as in the related art, there is a need of a space of nearly the design rule between the amplifier gate and the select gate. However, the structure of this embodiment eliminates such a dead space, making possible to correspondingly increase the space of a photodiode. Otherwise, the pixel part itself can be made smaller.

Meanwhile, because the diffusion layer does not exist between the amplifier gate and the select gate, the diffusion layer is free of sheet resistance and voltage drop. Also, the resistance and voltage drop, resulting from the LDD region at the end of the transistor gate, are eliminated at one end of the amplifier gate and at one end of the select gate. Accordingly, realized is the reduction of noise and voltage.

Incidentally, it is assumed in this embodiment that all the gate electrodes other than the amplifier gates of the pixel part are formed by the gate electrodes in the second level.

Now, the structure and operation of the solid-state imaging device of this embodiment will be explained in the order.

As shown in FIG. 1, the pixel part of the solid-state imaging device of this embodiment is configured with a photodiode (PD) 110, vertical signal line 112, MOS transistors 120, 122, 124, 126 and so on.

In FIG. 1, impedance is high at a lower end of the vertical signal line 112 (voltage output to a hereinafter-referred S/H-CDS circuit). The vertical signal line 112, at an upper end, is connected to a load transistor 114 as a constant current source at the outside of the pixel part.

A reset transistor 120 and a transfer transistor 122 are connected in tandem between a drive power source (drive voltage Vdd) and an output of the PD 110. An FD region 116 is provided between a source of the reset transistor 120 and a drain of the transfer transistor 122.

Meanwhile, the select transistor 124 and the amplifier transistor 126 are connected in tandem between the vertical signal line 112 and the drive power source (drive voltage Vdd), and the FD region 116 is connected to a gate of the amplifier transistor 126.

A reset pulse is inputted to the gate of the reset transistor 120, a transfer pulse is inputted to the gate of the transfer transistor 122, and a select pulse is inputted to the gate of the elect transistor 124.

In this embodiment, the gate electrodes of the amplifier transistor 126 and select transistor 124 are structured by the first and second levels of a two-level structure in a partly overlapped state. The select transistor 124 and the amplifier transistor 126 are closely formed in a state without having a diffusion layer.

Explanation will be now briefly made on the overall configuration of the MOS image-type imaging device in this embodiment, using FIG. 3.

An imaging section 200 has the pixel parts, configured in FIG. 1, vertically and horizontally arranged in multiplicity in a two-dimensional matrix form.

Meanwhile, a constant-current section 210 has a multiplicity of constant-current circuits arranged correspondingly to each pixel column. An S/H-CDS section 220 has a multiplicity of S/H-CDS circuits arranged correspondingly to each pixel columns.

Vertical (V) select means 230 is to select a row of the pixel parts. Horizontal (H) select mean 240 is to sequentially read out a signal held in the S/H-CDS circuit of the S/H-CDS section 220 onto the horizontal signal line 118. The read signal is processed in an output section 250 and outputted as an imaging signal.

Meanwhile, a TG 260 is a timing generator to generate and output a pulse required in the operation of these sections.

Explanation will be now made on the operation of the pixel part of this embodiment, using FIG. 2.

First, photoelectrons are stored onto the PD 110 in timing "t0" shown on a horizontal axis of FIG. 2. Next, the load transistor 114 is turned ON in timing "t1".

Then, a reset pulse is inputted to the reset transistor 120 in timing "t2" to reset the FD region 116.

Next, the select transistor 124 is turned ON in timing "t3".

Thereafter, the potential (reset level) on the vertical signal line 112 is taken by the rear-staged S/H-CDS circuit in a period shown in "t4".

Then, a transfer pulse is inputted in timing "t5" to transfer photoelectrons from the PD 110 to the FD region 116.

Thereafter, the potential (light level) on the vertical signal line 112 is again taken by the rear-staged S/H-CDS circuit in a period shown in "t6".

Next, the select transistor 124 is tuned OFF in timing "t7".

Then, a reset pulse is inputted in timing "t8" to again reset the FD region 116.

Finally, the load transistor 114 is tuned OFF in timing "t9".

The S/H-CDS circuit takes and holds a difference between the two signals taken in "t4" and "t6". This signal is sequentially taken out by the H select means 240 as in the above.

Although, three horizontal lines of reset, selection and transfer pass in the pixel part as noted above, the select gate is laid with a gate line extended as it is in a horizontal direction.

Meanwhile, the reset gate and the line gate are laid by metal lines passed in a horizontal direction. Due to this, a contact is provided onto the gate to be applied with voltage.

This is because of the finding that a second-level select gate rides on the first-level amplifier gate to cause a step so that a contact, if provided in the vicinity of that, results in yield and reliability degradation.

Also, because there are two horizontally extending metal lines per row, there is also an effect that an optical aperture is readily obtained thus being effective in pixel reduction.

Meanwhile, the transfer gate and reset gate lines structured by metal layers can reduce resistance and increase response speed.

Next FIG. 4 is a sectional view showing a manufacturing process for a solid-state imaging device configured in the above.

Explanation will now be made on a two-level gate forming process in this embodiment, with reference to FIG. 4.

Figure 4A:
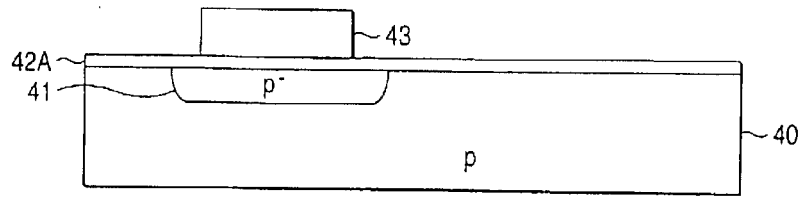
FIG. 4 is a sectional view showing a manufacturing process for a pixel part shown in FIG. 1.

First, in FIG. 4A, not-shown device isolation regions and well regions are formed in a silicon substrate 40. Threshold-controlling As is ion implanted to a region 41 where an amplifier gate is to be formed later. The region 41 is made into a P-type (P$^-$) lower in concentration than the P-well.

Next, an amplifier gate oxide film 42A is formed to thereafter deposit thereon Poly-Si (polysilicon) to be formed into a first-level gate electrode film. Phosphorus doping and patterning are carried out in the order to form an amplifier gate 43.

Figure 4B:
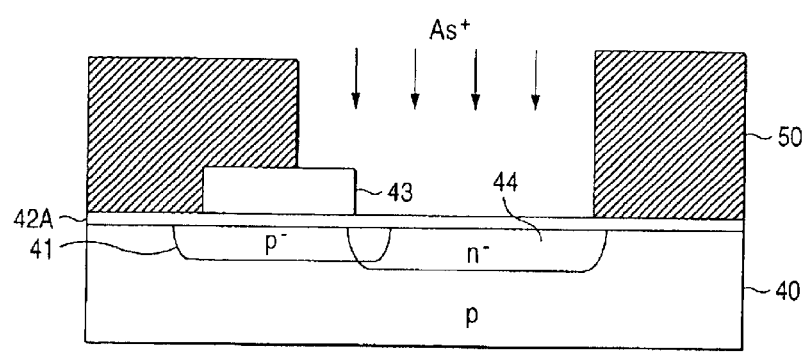

Next, in FIG. 4B, a mask of resist 50 is used on a region 44 where a select gate is to be formed later, to ion-implant As for threshold control.

Herein, there is no effect of deviation in mask alignment because of self-alignment at an end of the amplifier gate as shown in the figure. The dose is higher than that for the p-region 41, i.e. in a degree making the region 44 neutral or n$^-$.

Then, the oxide film 42A is once stripped away by a wet process, to cause re-oxidation thereby forming an oxide film 42B.

Poly-Si, to be formed into a second-level gate electrode film, is deposited on that layer. Phosphorus doping and patterning are carried out in the order, thereby forming a select gate 45 in a second level.

Figure 4C:
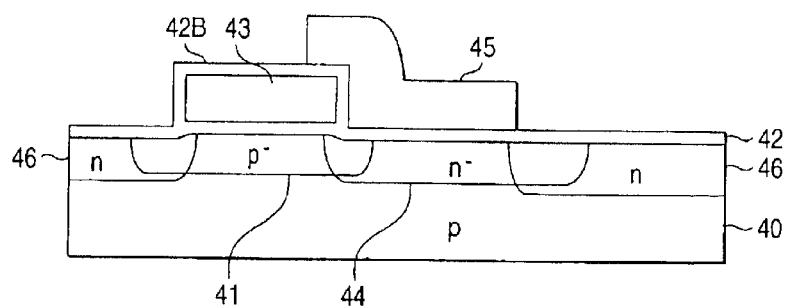

Next, in FIG. 4C, As is ion-implanted for LDDS in the opposite-sided regions 46. Thereafter, a TEOS layer 47 is deposited by LP-CVD and oxidized in a short time.

Furthermore, Poly-Si is deposited by LP-CVD and etched back in the entire surface, to form a sidewall 48.

Figure 4D:
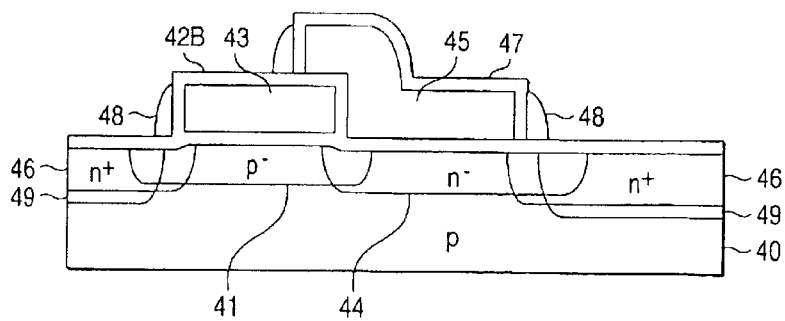

Next, in FIG. 4D, n$^+$ ions are implanted, for S/D, in regions 49 deviated somewhat outside of the LDD regions 46. The Poly-Si of the sidewall 48 is removed by CDE.

Incidentally, the subsequent processes have no direct bearing on the invention and hence omittedly explained.

Herein, the characterization lies in that the ion implant region for controlling a threshold of the select transistor is n-type and the amplifier gate is formed self-aligned at its one end.

Namely, despite the amplifier gate and the select gate have a distance of approximately 10 nm by an amount of a thin oxide film, slight potential barrier occurs upon flowing a current. However, the potential barrier can be eliminated by the n-type ion-implant region.

Also, in case the ion implant region deviates at its edge, it causes characteristic variation in the amplifier transistor. This, however, can be prevented by self-alignment.

In the solid-state imaging device in the present embodiment structured as above, the following effect can be obtained by the following structure.

First, because the amplifier gate and select gate can be arranged adjacent without a spacing, the pixel can be size-reduced or the photodiode can be size-increased.

Also, it is possible to realize reduction of voltage and noise by decreasing the resistance through a current path.

Also, by providing only a select gate by directly a gate line in a horizontal direction to lay reset and transfer gates in the upper-level metal line, it is possible to exclude the deterioration in reliability in providing a contact in the select gate having a step caused by the overlap in a two-level gate as shown in FIG. 4, and to prevent the deterioration yield and reliability encountered in a two-level gate. Meanwhile, by broadening the optical aperture of the pixel, it is possible to achieve size reduction of the pixel part.

Meanwhile, by implanting n-type ions in the ion-implant region for controlling a threshold of a select transistor by self-alignment after forming an amplifier gate, the amplifier transistor can be suppressed from deviating in its characteristic. Also, eliminated can be a potential gap as encountered in the two-level gate.

Incidentally, although the above explained on the example that the pixel part was configured with one photodiode and four MOS transistors, the invention is not limited to such a structure but is applicable to a structure having at least photoelectric converting means and amplifier-and-select two transistors. Modification is possible concerning the other structural elements.

According to the solid-state imaging device of the invention, the gate electrode of the pixel part is formed in a two-level structure wherein the gate electrode of the amplifier transistor is formed in a first level of the two-level structure and the gate electrode of the select transistor is formed in a second level of the two-level structure. Consequently, because the gate of the amplifier transistor and the gate of the select transistor can be closely arranged without a spacing, it is possible to reduce the arrangement space of the amplifier and select transistors. This contributes to size reduction of the solid-state imaging device entirety due to the size reduction in the pixel parts. Correspondingly, the arrangement space of the photoelectric converting means can be enlarged, making possible to contribute to the improvement in imaging sensitivity.

Meanwhile, because the amplifier transistor and the select transistor are closely arranged, the resistance on a current path can be reduced to realize the reduction in voltage and noise.

According to the method for manufacturing a solid-state imaging device of the invention, the gate electrode of the pixel part is formed in a two-level structure wherein the gate electrode of the amplifier transistor is formed in a first level of the two-level structure and the gate electrode of the select transistor is formed in a second level of the two-level structure. This can reduce the arrangement space of the amplifier and select transistors, thus contributing to size reduction of the solid-state imaging device entirety due to the size reduction in the pixel parts. Correspondingly, the arrangement space of the photoelectric converting means can be enlarged, making possible to contribute to the improvement in imaging sensitivity.

Meanwhile, because the amplifier transistor and the select transistor are closely arranged, the resistance on a current path can be reduced to realize the reduction in voltage and noise.

Furthermore, in this manufacturing method, a channel layer of the select transistor is formed self-aligned by implanting ions to a region below the gate electrode of the select transistor after forming a gate electrode of the amplifier transistor in the first level. Consequently, the amplifier transistor can be suppressed from deviating in characteristic. Eliminated is a potential gap as encountered in the two-level gate.

What is claimed is:

1. A solid-state imaging device having an imaging section having a plurality of pixel parts, the pixel part comprising:

photoelectric converting means for storing photo-charge depending upon an amount of light reception;

an amplifier transistor for taking out a signal corresponding to the photo-charge stored on the photoelectric converting means;

a select transistor for connecting selectively an output of the amplifier transistor to a signal line that is connected to a current source at an outside of the imaging section;

a gate electrode of the pixel part formed in a two-level structure;

a gate electrode of the amplifier transistor formed in a first level of the two-level structure; and a gate electrode of the select transistor formed in a second level of the two-level structure.

2. A solid-state imaging device according to claim 1, wherein the select transistor has a channel layer formed self-aligned by implanting ions to a region below the gate electrode of the select transistor after forming a gate electrode of the amplifier transistor in the first level.

3. A solid-state imaging device according to claim 1, further comprising a floating diffusion region for receiving the photo-charge stored by the photoelectric converting means and supplying same to the gate electrode of the amplifier transistor, transfer means for transferring the photo-charge stored by the photoelectric converting means to the floating diffusion region, and a reset transistor for resetting the photo-charge transferred to the floating diffusion region.

4. A solid-state imaging device according to claim 3, wherein the pixel part is formed with a photo-sensor element as the photoelectric converting means, a transfer transistor as the transfer means, the reset transistor, the amplifier transistor and the select transistor.

5. A solid-state imaging device according to claim 3, wherein the select transistor has a gate laid as a gate line as it is, a gate of the transfer transistor and a gate of the reset transistor being laid up to a metal line in the upper level.

6. A method for manufacturing a solid-state imaging device having an imaging section having a plurality of pixel parts, the pixel part comprising:

photoelectric converting means for storing photo-charge depending upon an amount of light reception;

an amplifier transistor for taking out a signal corresponding to the photo-charge stored on the photoelectric converting means;

a select transistor for connecting selectively an output of the amplifier transistor to a signal line that is connected to a current source at an outside of the imaging section;

a gate electrode of the pixel part formed at least in a two-level structure;

a gate electrode of the amplifier transistor formed in a first level of the two-level structure; and a gate electrode of the select transistor formed in a second level of the two-level structure;

wherein the select transistor has a channel layer formed self-aligned by implanting ions to a region below the gate electrode of the select transistor after forming a gate electrode of the amplifier transistor in the first level.

7. A method for manufacturing a solid-state imaging device according to claim 6, wherein the select transistor has a gate laid as a gate line as it is, a gate of the transfer transistor and a gate of the reset transistor being laid up to a metal line in the upper level.

* * * * *